Feb. 2, 1954 R. M. NORDBY 2,668,235

TUNING SYSTEM FOR WAVE-SIGNAL RECEIVERS

Filed Oct. 25, 1951

3 Sheets-Sheet 1

INVENTOR:
ROGER M. NORDBY.
BY Francis W. Crotty
HIS ATTORNEY.

INVENTOR:
ROGER M. NORDBY
BY Francis W. Crotty
HIS ATTORNEY.

INVENTOR:
ROGER M. NORDBY
BY Francis W. Crotty
HIS ATTORNEY.

Patented Feb. 2, 1954

2,668,235

UNITED STATES PATENT OFFICE 2,668,235

TUNING SYSTEM FOR WAVE-SIGNAL RECEIVERS

Roger M. Nordby, Evanston, Ill., assignor to Zenith Radio Corporation, a corporation of Illinois Application October 25, 1951, Serial No. 253,146

7 Claims. (Cl. 250—20)

This invention relates, in general, to a system for tuning a wave-signal receiver selectively to utilize any of a group of signals included within a certain band of frequencies. More particularly, it is directed to a tuning system or channel selector for a television receiver which utilizes signals translated over channels that may be distributed in the very-high-frequency (V. H. F.) band as well as in a separate and distinct ultra-high-frequency (U. H. F.) band. For convenience, the detailed explanation will be devoted to the application of the invention to such a television receiver.

At the start of commercial telecasting, signal channels were assigned by the Federal Communications Commission in a V. H. F. band extending between 54 and 216 megacycles and tuning systems were developed to permit a given receiver to accept and utilize a program translated over any of those channels. One popular form of tuning system heretofore employed is the so-called turret tuner which comprises essentially a cylindrical carrier about the periphery of which are removably attached a series of tuning strips. Each strip includes a radio-frequency selector and a tuning reactance for the heterodyning oscillator, adjusted in relation to the associated selector so as to impose an operating frequency on the oscillator of appropriate value to permit the frequency converter of the receiver to develop a signal of a predetermined intermediate frequency and representing the program received over the channel to which that selector is pretuned. In some instances, the tuning strip also has a selector for the converter, adjusted to match the adjustment of the R. F. selector provided on the strip. While the several tuning strips have the same construction and arrangement, they are individually adjusted to be selective to one of the available signal channels and they may be connected into operative relation with the receiver circuits by stationary contacts supported in juxtaposition to the turret in such a way that rotation of the turret causes circuit contacts on the strips, in turn and individually, to be brought into circuit engagement with the stationary contacts.

It is now known that further television channels will be assigned in a different frequency band, extending from 470 to 890 megacycles and referred to as the U. H. F. band, and it is highly desirable that any receiver manufactured for commercial sale be capable of accepting telecasts in channels either in the V. H. F. or U. H. F. bands. One proposed solution to that problem contemplates the use of U. H. F. tuning strips that may be applied to the turret in place of one or more of the V. H. F. strips since it is unlikely that any given area will have available all of the channels in both the V. H. F. and U. H. F. bands. The U. H. F. strips may comprise an R. F. selector adjusted to select one U. H. F. channel; a crystal-harmonic generator to be energized by the heterodyning oscillator of the receiver when the U. H. F. strip is in operating position; and a crystal mixer responsive to the selected channel and to the output of the harmonic generator to provide a suitable intermediate-frequency signal for translation through the receiver. While arrangements of this type have been satisfactorily operated and constitute an acceptable and commercially useful answer to the problem of V. H. F. and U. H. F. reception, it may be desirable to use a different form of tuning system, of the type to be described herein, because of certain characteristics in respect of the number of crystals required and in respect of the problem of oscillator radiation. Also, a turret with only 12 channels will be inadequate in many locations when all the stations contemplated are operative. A turret with say 15 to 25 channel strips is larger and not so easily installed in a television set. It is accordingly an object of this invention to provide an improved tuning system for a wave-signal receiver and, more particularly, for a television receiver to operate in both the V. H. F. and U. H. F. bands.

A more specific object of the invention is to provide an improved and simplified system for tuning a television receiver selectively to any of a group of television channels distributed in the V. H. F. and U. H. F. bands.

A further object of the invention is to provide an improved and simplified tuning system for a wave-signal receiver employing a small number of component parts and having an improved characteristic in respect of oscillator radiation.

A tuning system, in accordance with the subject invention, for tuning a wave-signal receiver selectively to utilize any of a group of wave signals included within a given band of frequencies comprises a movable carriage and a plurality of radio-frequency selectors. Those selectors are individually selective to a different one of the aforesaid wave signals and are mounted on the carriage to be moved sequentially into an operating position and a driving system, coupled to the carriage, effects movement thereof. There is a stationary connector located at the aforementioned operating position for establishing circuit connections with the one of the selectors that is moved into that position. A heterodyning oscillator is provided, being tunable over an operating frequency range corresponding to the band of frequencies to be received and including a physically displaceable tuning element. An individual and adjustable actuator is associated with each of the selectors and is moved into actuating engagement with the oscillating-tuning element as its associated selector is moved into the aforementioned operating position. Finally, a frequency converter is provided in circuit engagement with the oscillator, the connector, and the selector which is instantaneously in the operating position. This converter develops an intermediate-frequency signal corresponding to the wave signal selected by the operative selector.

The features of the present invention which are believed to be novel are set forth with particularity in the appended claims but its organization and manner of operation, together with further objects and advantages thereof, may be best understood by reference to the following description taken in connection with the accompanying drawings in which:

Figure 1:
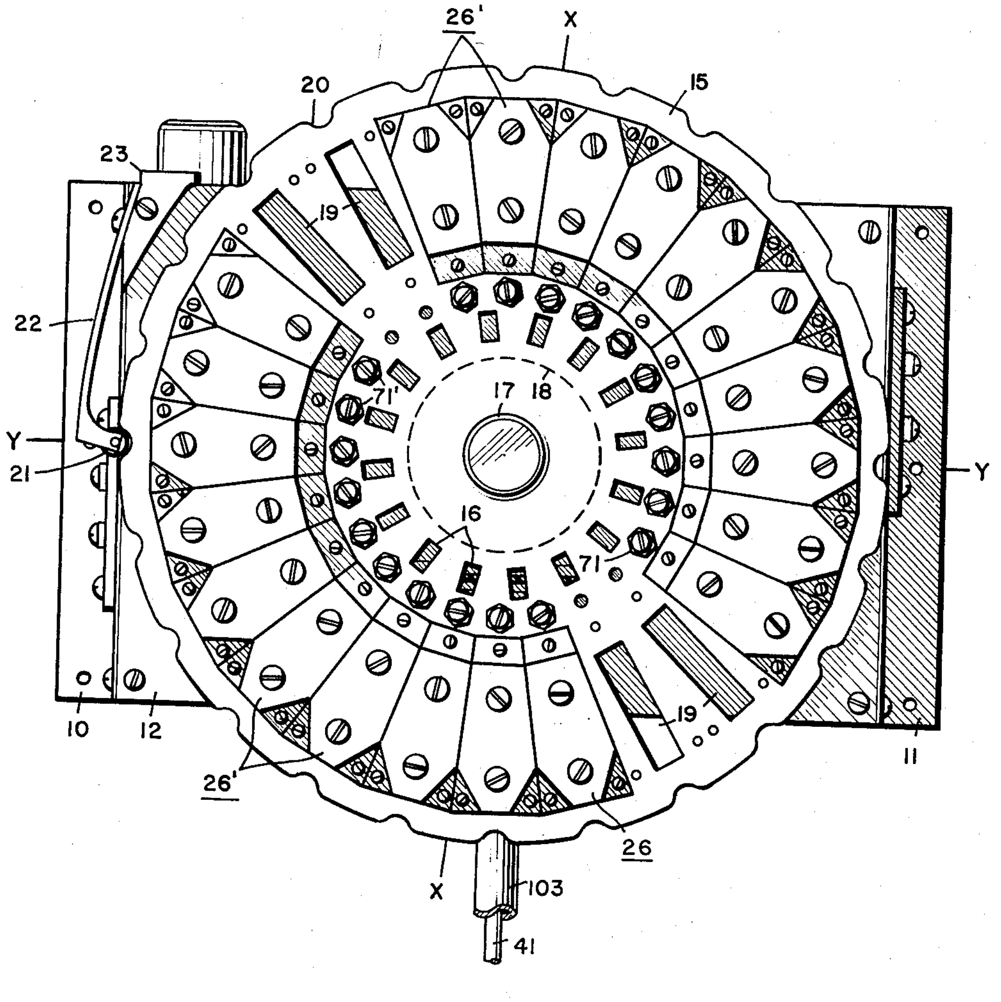
Figure 1 is a plan view of a tuning system constructed in accordance with the invention.
Figure 2:
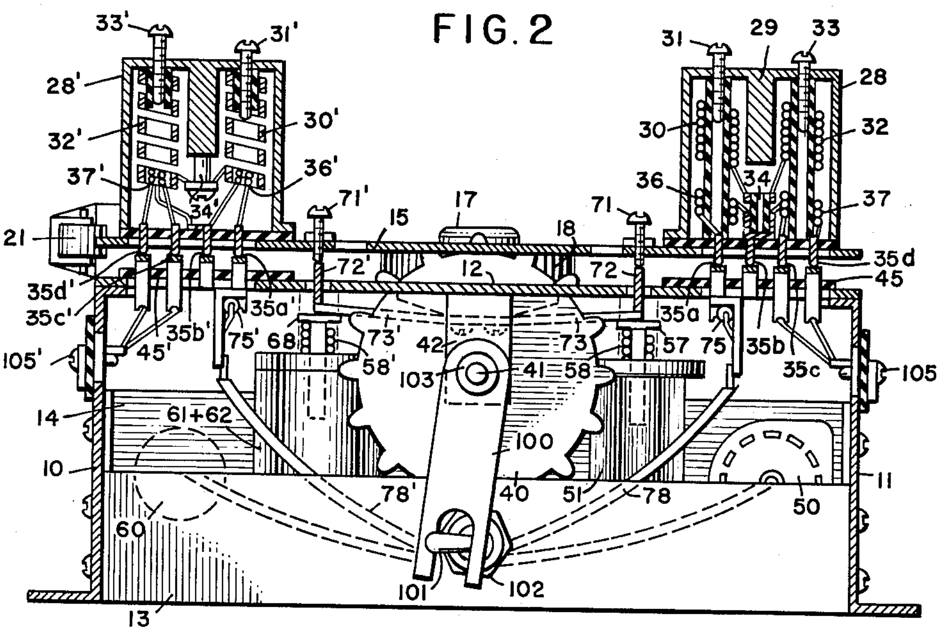
Figure 2 is an elevation, partially in section, of the tuning system of Figure 1.
Figure 3:
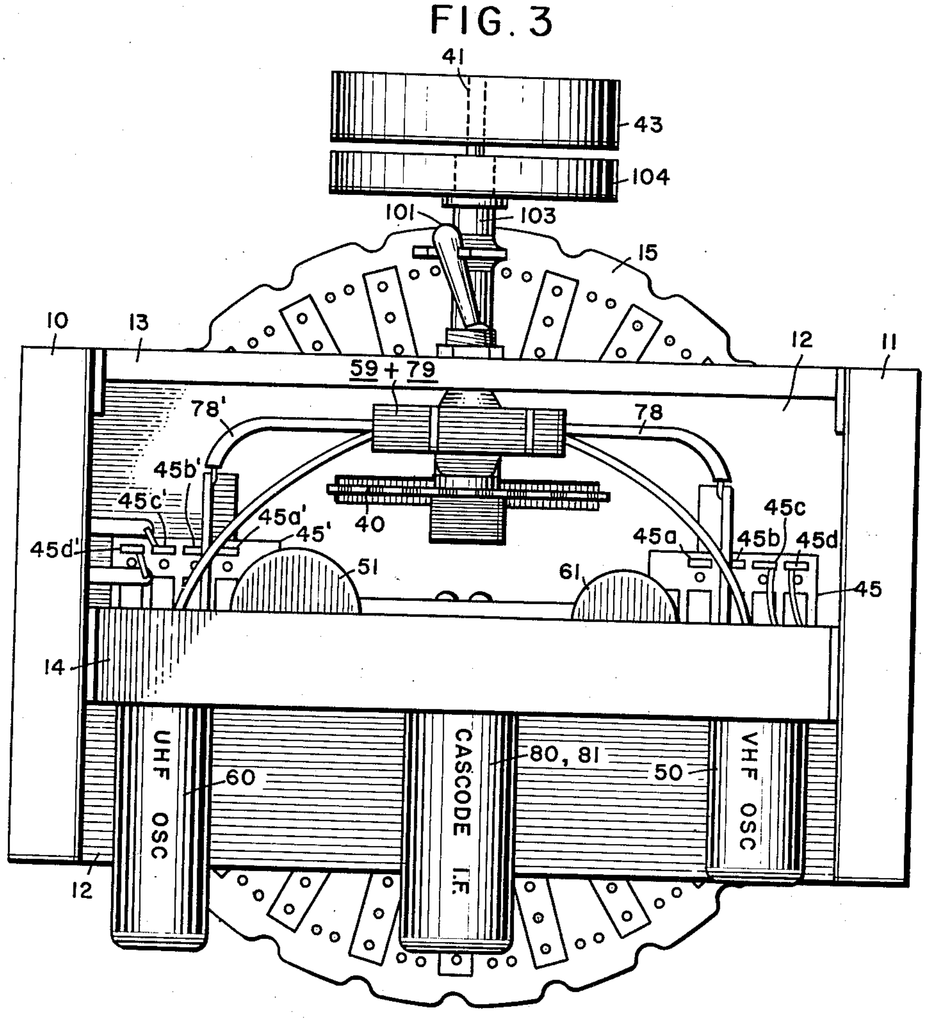
Figure 3 is a bottom view of the tuning system.

Referring now more particularly to Figures 1, 2, and 3, collectively, the arrangement there represented is a system for selectively tuning a television receiver to any signal channel in either the V. H. F. or U. H. F. bands. It comprises a chassis having end or side partitions 10 and 11 and a horizontally disposed top portion or shelf 12 secured to and supported by the end plates. A front plate 13, of approximately one third the height of the end plates, is disposed at the front of the chassis; and intermediate the end plates approximately midway from the front is a further vertical partition 14 for supporting tube sockets and other circuit components to be considered more particularly hereinafter. The chassis supports a movable carriage, here shown as a rotatable turntable 15 having a circular array of apertures 16 disposed about its axis of rotation. The turntable may be centrally apertured to receive a stub shaft 17 extending from a bearing 18 rotatably supported on top shelf 12 of the chassis. The turntable has a further circular pattern of radially extending slots 19 for receiving contact blocks of radio-frequency selectors. The outer periphery of the turntable has a recess 20 in line with each of the radially disposed slots for indexing purposes and indexing is accomplished by a detent 21 secured at the free end of a resilient arm 22 supported from a mounting block 23 which is attached to the chassis shelf 12. The resilient arm 22 biases detent 21 into peripheral engagement with the turntable.

A plurality of radio-frequency selectors 26 are removably mounted on and insulated from the turntable to be moved sequentially into either of a pair of operating positions to be identified hereinafter. The number of selectors that may be accommodated is determined by their physical dimensions in relation to the diameter of the turntable and it has been found entirely practical to provide 24 locations at each of which a selector may be mounted through removable mounting screws as indicated. Where a family of 24 selectors is made available, one half are devoted to signal channels in the V. H. F. band and the other half to channels in the U. H. F. band and each selector is selective to a different signal channel in its assigned band. It may be convenient to consider that all of the selectors to the right of the reference axis $x$—$x$ of Figure 1 are selective to channels in the V. H. F. band and those to the left of that reference are devoted to the U. H. F. band.

Figure 4:
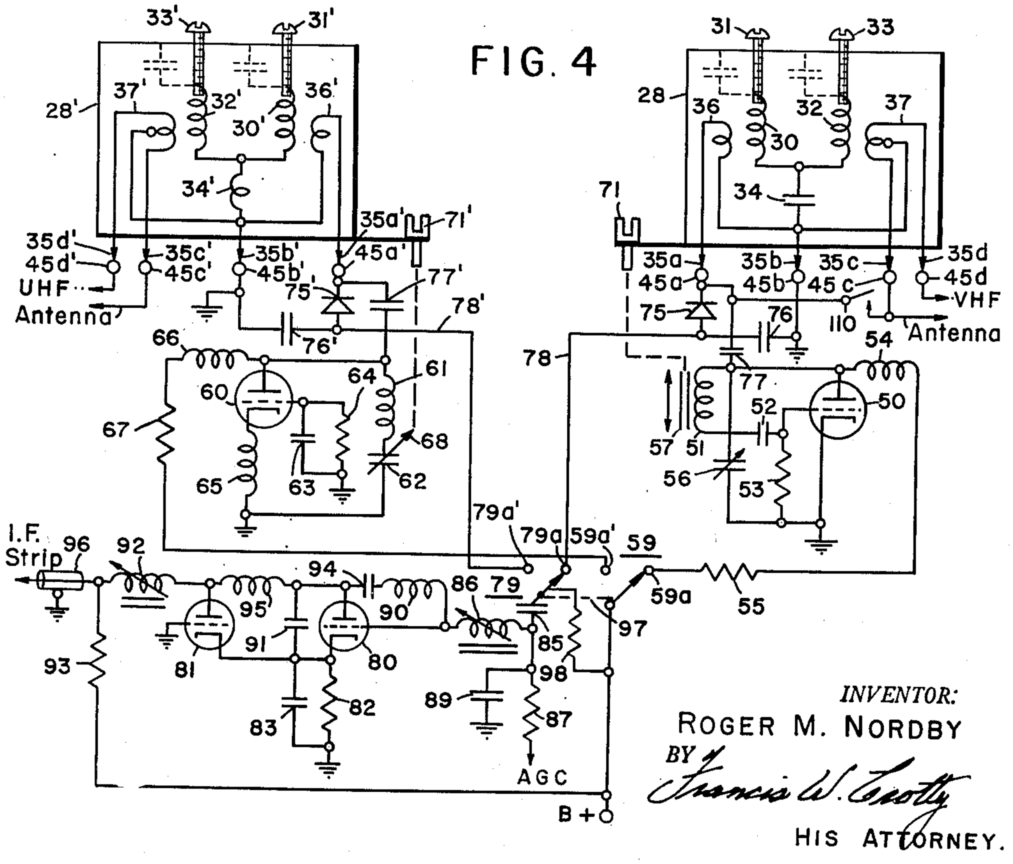
Figure 4 is a schematic diagram representing the circuitry of the tuning system.

Moreover, components employed in V. H. F. reception which have counterparts assigned to U. H. F. reception are designated by like reference characters although a distinguishing prime suffix is attached to the corresponding U. H. F. components. While the selectors may have any of a variety of forms, representative constructions are illustrated in Figure 2. The V. H. F. selectors there represented comprise a shield housing 28 of conductive material having a central partition 29 dividing the housing into a pair of mutually shielded compartments. In one of these compartments there is a variable inductor 30 having a conductive tuning slug 31 providing an A. C. connection from the uppermost end of the inductor to the shield housing and permitting the effective impedance to be varied with the adjusted position of the slug. A similar inductor 32 and associated tuning slug 33 are accommodated by the other shield compartment and the adjacent ends of these inductors are connected to the external peripheral electrode of a tubular ceramic condenser 34. The internal peripheral electrode of the condenser is connected to a ground terminal **35*b* included in the contact block of the selector which extends through a radial slot of the turntable. Disposed in coaxial alignment with the inductor 30 is a further inductor or pick-off coil 36 having one terminal connected to ground contact 35*b* and the other connected to a contact 35*a* through which the output signal of the selector is applied to a frequency converter presently to be described. In like fashion, an antenna coil 37 is aligned coaxially with coil 32 and has terminals connected to contacts 35*c* and 35*d*** to which a V. H. F. antenna may be connected. The identification and relative position of the several contact terminals of the selector is more clearly represented in the schematic circuit diagram of Figure 4.

The U. H. F. selector represented in Figure 2 is enclosed in a similar shield housing 28′ and likewise comprises a pair of variable inductors 30′ and 32′ individually having adjustable tuning slugs 31′ and 33′. In this selector, however, the common coupling impendance 34′ is inductive and may comprise a sleeve of conductive material attached by means of a mounting screw to the shield housing. Again, there is an output inductor 36′ which is here disposed interiorly of inductor 30′ and an antenna coupling coil 37′ similarly arranged in respect of inductor 32′. The common or coupling inductor 34′ is connected to a ground contact **35*b*′; the antenna coil is connected to antenna contacts 35*c*′ and 35*d*′; and the pick-up coil is connected to an output contact 35*a*′. In the case of both selectors, center taps of the antenna coils are also connected to the ground terminals 35*b* and 35*b*′**.

There is a mechanical driving system provided for rotating the turntable 15 in order to bring any of the selectors into operating relation with the other circuits of the tuning system, and into circuit relation with the remaining stages of the receiver. This driving system includes a gear 40 rotatable with a driving shaft 41 which, in turn, is supported by a bearing 42 secured to top shelf 12 of the chassis. An extension of shaft 41 is provided with a knurled actuating knob 43 to facilitate turning gear 40 and the turntable. The driving connection between gear 40 and the turntable is established by the meshing engagement of the teeth of the gear with a circular array of apertures 16 of the turntable.

Reference has heretofore been made to an operating position into which a given selector is moved to associate it operatively with the controlled receiver. For the particular embodiment under consideration wherein the receiver is to utilize channels included in the V. H. F. band as well as in the U. H. F. band, there are two such operating positions disposed along the reference axis $y—y$ of Figure 1 and on appropriate sides of the axis of rotation of the turntable. A stationary connector is located at each such operating position to engage the contact block of the particular selector which has been moved into that operating position. More specifically, and as shown in Figure 2, there is a first stationary connector 45 having a set of contacts for engaging contacts 35*a*—35*d* of any V. H. F. selector moved into the operating position represented by that connector. There is a similar connector 45′ located at the other operating position and having a family of contacts for engaging the terminals extending from the contact block of the U. H. F. selector brought into that operating position. These stationary connectors 45 and 45′ facilitate connecting a particular selector, a heterodyning oscillator and a frequency converter to develop an intermediate-frequency signal corresponding to the wave signal selected by the operative selector.

Since the tuner has been described as operating in two bands, it may be most convenient to employ a pair of heterodyning oscillators, individually tunable over an operating frequency range corresponding to a particular one of the bands. The heterodyning oscillator for the V. H. F. band, as represented schematically in Figure 4, includes an electron-discharge device or triode vacuum tube 50 having a variable inductor 51 connected between its anode and control grid and tuned by the interelectrode capacitance and other stray capacitance effects. The grid of the tube is connected to one end of the tuning inductor through a condenser 52 and is connected to ground through a grid resistor 53. The cathode is directly grounded and the anode is connected through a choke 54 and a resistor 55 to a switch contact 59*a*. If desired, a trimmer condenser 56 may be included in the oscillator. Preferably, there is a tuning core or slug 57 associated with inductor 51 and physically displaceable along a given path to tune the oscillator over its operating frequency range. This core is indicated schematically in Figure 4 and is shown in Figure 2 where it is apparent that the core is biased toward the operating position of the V. H. F. selectors by means of a compression spring 58 which tends to tune the oscillator to one end of its operating band.

The heterodyning oscillator associated with the group of U. H. F. selectors comprises an electron-discharge device or triode vacuum tube 60 having a frequency-determining circuit connected between its anode and cathode and comprising an inductor 61 and a variable condenser 62. The control electrode is connected to ground through a self-biasing network including a condenser 63 and a resistor 64. The cathode is grounded through an R. F. choke 65 and a circuit for applying an operating potential to the anode extends through a choke 66 and a resistor 67 to a second contact 59*a′* of switch 59. An oscillator of this type is described and claimed in the copending application of John F. Bell, Serial No. 164,748, filed on May 27, 1950, and assigned to the same assignee as the present invention. It is tunable over an appropriate range of frequencies for establishing the intermediate frequency of the receiver during the reception of a U. H. F. channel and the instantaneous operating frequency necessary to that end is established by a physically displaceable tuning element 68 of the oscillator indicated schematically in Figure 4. Actually, the coil 61 and condenser 62 may take the form of a series of convolutions of conductive ribbon or the like having a conductive slug extending into one of the coils to constitute therewith a condenser exhibiting a capacitance that is variable with the axial displacement of the tuning slug. Thus as indicated in Figure 2, the displaceable tuning element 68 is a slug biased by a compression spring 58′ toward the operating position of the U. H. F. selector, normally to adjust the operating frequency of the oscillator to one end of its frequency range.

The instantaneous tuning position of the displaceable tuning elements 57 and 68 of the oscillators 50 and 60 is under the control of an individual and adjustable actuator which is associated with each R. F. selector and moved into engagement with one of the tuning elements as its associated selector is moved into its operating position. These actuators may conveniently take the form of screws 71, 71′ which thread through holes in the turntable in radial alignment with the positions occupied by the R. F. selectors. As clearly shown in Figure 2, the actuator 71 of a V. H. F. selector is placed into actuating engagement with tuning slug 57 of oscillator 50 through a cam segment 72 supported at the free end of a leaf spring 73 secured to the chassis. The spring biases the cam segment into the path of the actuator and the leading and trailing edges of the cam are preferably bevelled to facilitate effecting a mechanical linkage between the actuator and slug 57 as that actuator moves into the operating position from either direction. A similar cam segment 72′ and leaf spring 73′ are provided to couple the actuator 71′ associated with any U. H. F. selector to tuning slug 68 of oscillator 60.

The heterodyning of a signal from the heterodyning oscillator with the program signal selected by any R. F. selector is accomplished in a converter and, while an individual converter may be physically included within the housing of each selector, it is preferred that one converter be provided to cooperate with any of the V. H. F. selectors 26 and a second converter be associated with any of the U. H. F. selectors 26′. Accordingly, a crystal mixer 75 is secured to the chassis adjacent the V. H. F. stationary connector 45 and a similar crystal type mixer 75′ is mounted on the chassis adjacent the U. H. F. stationary connector 45′. These crystals are in essentially permanent electrical connection with the heterodyning oscillators and the stationary connectors as represented in the schematic circuit diagram of Figure 4.

One terminal of crystal 75 is permanently connected to contact 45*a* of stationary connector 45 and its other terminal is grounded through ground contact 45b and R. F. by-pass condenser 76. The permanent connection from the V. H. F. heterodyning oscillator 50 is made through a coupling condenser 77 to the crystal terminal 45a. There is an output lead 78 from the crystal which extends to one contact 79a of a switch 79. In like manner the U. H. F. heterodyning oscillator 60 is permanently connected to its mixer 75′ through a condenser 77′ and an output connection from that mixer is made through a conductor 78′ extending to contact 79a′ of switch 79. While one terminal of mixer 75′ is connected to a contact 45a′ of the U. H. F. stationary connector, its other terminal is grounded through a by-pass condenser 76′.

The intermediate-frequency signal obtained from either crystal mixer 75 or 75′ is applied through switch 79 to the input circuit of a cascode intermediate-frequency amplifier comprising a pair of triode vacuum tubes 80 and 81. The cathode of tube 80 is connected to ground through the parallel combination of a resistor 82 and a condenser 83. Its grid is connected to the movable contact of switch 79 through a condenser 85 and a variable inductor 86 adjusted to have the input circuit series resonant at the intermediate frequency of the receiver. An automatic gain control potential obtained from a suitable source in the receiver (not shown) may control the gain of the cascode amplifier, being connected to the input circuit of tube 80 from the AGC bus through a resistor 87. A filter condenser 89 may also be provided if desired. The inductor 90 and condenser 94 coupled between the anode and grid of tube 80 are for neutralizing purposes and the output signal of tube 80 cathode drives the succeeding tube 81, being applied to the cathode thereof through a coupling condenser 91. The grid of tube 81 is grounded and its anode circuit is connected to a source of operating potential +B through a variable inductor 92 and a series resistor 93. A choke 95 extends the B-supply circuit to the anode of tube 80 and the output signal of the cascode amplifier may be applied through a shielded cable 96 to the succeeding stages of the receiver.

Obviously, an output signal is to be obtained from only one of the crystal mixers 75 and 75′ at any given operating instant and this is accomplished by switches 59 and 79 which are mechanically interconnected, as shown by broken construction line 97, for unicontrol operation. The movable contact of switch 59 extends to the B-supply and energizes the oscillators 50 and 60 in alternation, depending on whether the movable element of the switch engages contact 59a or 59a′. In the same fashion, the movable element of switch 79, by engaging contact 79a or 79a′, may couple the mixer 75 on one hand or the mixer 75′ on the other to the input circuit of cascode amplifier 80—81. It is found expedient to operate the crystal mixers, in accordance with the disclosure of copending application Serial No. 200,457, now Patent No. 2,640,919, granted June 2, 1953, to John F. Bell and Roger M. Nordby filed December 12, 1950, and assigned to the same assignee as the present invention, with a fixed current bias obtained through a resistor 98 which is connected between the high potential side of the potential source +B and the movable contact of switch 79. The other terminal of the source +B is grounded as is one terminal of each of the crystal mixers, the connection to ground being provided through the output coil 36 or 36′ of the selector which is connected to ground contact 45b or 45b′ of stationary connector 45 or 45′. The unicontrolled operation of switches 59 and 79 is effected by a switch operating lever 100 having a bifurcated termination which receives a common displaceable element 101 of a composite switch 102, shown in Figure 2 and there representing a combined switch structure including the aforementioned switch sections 59 and 79. Switch actuating lever 100 is secured to a shaft 103 that is coaxial with the driving shaft of the turntable and has a knurled operating handle 104 in juxtaposition with the hand knob 43 of the driving shaft.

Antenna terminals 105 for receiving the lead in from a V. H. F. antenna are mounted on end plate 11 of the chassis and are connected with contacts 45c and 45d of stationary connector 45. Corresponding antenna terminals 105′ for connection with a U. H. F. antenna are positioned on end plate 10 and are connected with contacts 45c′ and 45d′ of stationary connector 45′.

In considering the operation of the described tuning system, any desired selector assigned to a channel in the V. H. F. or U. H. F. band may be moved into its operating position by rotating the turntable through driving gear 40 by control knob 43 until that selector is directly over its stationary connector, connector 45 for a V. H. F. selector and connector 45′ for a U. H. F. selector. Such an operating condition of the tuning system is represented in Figure 2 wherein it is apparent that the selector in each of the operating positions is effectively in functional association with the receiver by virtue of the circuit engagement of the several contacts of the stationary connector with the corresponding contacts of the contact block of the selector which project through slot 19 of the turntable. The resulting circuit condition is that shown in Figure 4.

If it is assumed that reception of a V. H. F. channel is desired, actuating knob 104 is manipulated to displace lever 100 and actuate composite switch structure 102, placing the movable element of switch 59 in engagement with contact 59a and the movable element of contact 79 in engagement with switch contact 79a as indicated. The mating contacts of switch 59 apply an operating potential to the V. H. F. heterodyning oscillator 50, while the mating contacts of switch 79 concurrently apply a current bias to crystal 45 and connect the output lead 78 from that crystal to the input circuit of cascode amplifier 80—81. At the same time, the actuator 71 of the particular V. H. F. selector, through its engagement with cam segment 72 and tuning slug 57, effects such displacement of that slug as to impose an operating frequency on heterodyning oscillator 50 of the necessary value to receive the channel to which the operative V. H. F. selector is assigned. Accordingly, the heterodyning oscillator is conditioned for operation as is mixer 75. The desired V. H. F. channel program is applied through antenna terminals 45c, 45d to antenna coil 37 of the selector and is thereby delivered to the selector network 30, 32, 34. The particular channel, after selection by that network, is supplied through pick-off coil 36 of the selector to crystal mixer 75 which concurrently receives a heterodyning signal from oscillator 50. The resulting intermediate-frequency signal developed by the crystal mixer is selected at the input circuit of the cascode amplifier and is translated therethrough to the shielded cable 96 which leads to succeeding stages of the receiver.

Should reception of the U. H. F. channel be desired, lever 100 is displaced to its alternate position by knob 104 to switch the movable elements of switches 59 and 79 to contacts 59a' and 79a', respectively. With the switches in this condition, energizing potential is applied only to U. H. F. oscillator 60 and not to V. H. F. oscillator 59; current bias is established for crystal mixer 75' and is interrupted in respect of crystal mixer 75; and the input circuit of cascode amplifier 80—81 is shifted to receive the output signal of mixer 75'. Moreover, the signals intercepted by the U. H. F. antenna are applied through antenna terminals 45c' and 45d' of stationary connector 45' to antenna coil 37' included in the U. H. F. selector. The desired signal channel is singled out by the selective properties of selector network 30', 32', 34' and is delivered to pick-off coil 36' of the selector. It reaches mixer 75' through selector contact 35a' which engages stationary contact 45a'. A heterodyning signal, adjusted in frequency to the appropriate value by components 71', 72' and tuning slug 68, is concurrently delivered to crystal mixer 75' which develops an output signal of the same intermediate frequency as obtained from crystal mixer 75. It is selected by and translated through cascode amplifier 80, 81.

By assigning one half of the turntable to V. H. F. selectors and the remaining half to U. H. F. selectors as suggested, it is conveniently possible to provide for the selection of 24 signal channels in the V. H. F. and U. H. F. bands. At the same time, a relatively small displacement of the turntable is required to adjust the tuning system to a given channel in either band. Switches 59 and 79 provide the control necessary to associate a selector designed for channel selection in the U. H. F. band to the U. H. F. heterodyning oscillator and also establish the control for assuring that a V. H. F. selector may conveniently be associated with the V. H. F. heterodyning oscillator. For that reason all of the actuators 71, 71' for the tuning elements of the heterodyning oscillators, may be disposed along the same circular path of the turntable. For the same reason, it is feasible to have the several contacts of stationary connectors 45 and 45' as well as the contacts extending from the several selectors disposed along common and concentric paths. By displacing both the stationary and movable contacts involved in U. H. F. reception radially in respect of those employed in V. H. F. reception, the contacts of any V. H. F. selector may be prevented from engaging circuit elements intended for U. H. F. reception and vice versa. The same is true as to the actuators for the heterodyning oscillators; a slight radial displacement of one tuning slug 57 or 68 relative to the other and a related displacement of the actuators associated with the selectors of the V. H. F. band in comparison with those of the U. H. F. band prevents tuning of either heterodyning oscillator by a selector that is not intended for operation in conjunction therewith. However, the described arrangement has adequate precautions and is more simple to adopt.

Among the advantages of the described tuner is the use of a common converter, specifically a crystal mixer, for V. H. F. reception and a single mixer for U. H. F. reception. It is also to be noted that relatively movable contacts for the heterodyning oscillators are not required since the oscillators are essentially in permanent electrical connection with stationary connectors 45 and 45'. The necessary variation in operating oscillator frequency is obtained through a mechanical displacement of a tuning element rather than through the selective introduction into the oscillator of a tuning reactance such as a condenser or inductor. The use of relatively movable contacts for the oscillator may adversely effect the tuner at the operating frequencies involved.

It will further be observed that the heterodyning oscillator energy does not traverse mating contacts or any of the relatively movable elements of the tuner as is characteristic of other tuning mechanisms. No component of the heterodyning oscillator is included in the arrangement on the rotatable turntable. This permits more facile handling of the oscillator radiation problem and reduces that problem which may otherwise be exaggerated when the oscillator energy flows through tuning components carried by a turret or turntable.

A single pole, single-throw switch 110 may bridge contacts 45a and 45c of stationary connector 45 and a similar switch may be bridged between corresponding elements of the other connector 45'. The inclusion of such a switch simplifies adjustment of the tuner in the field. For example, in arriving at the adjustment of a given actuator 71 the switch 110 may be closed to apply all received channels of the V. H. F. band to the mixer 75. The actuator 71 may be adjusted to peak one channel to the intermediate frequency. During this adjustment, the associated selector is short-circuited by switch 110 which now may be opened and the tuning adjustments 31 and 33 of that selector adjusted again to peak that channel to the intermediate frequency.

If desired, intermediate-frequency signal traps may be included in the antenna lead in circuits to minimize intermediate-frequency interference. Moreover, a trap, selective to a channel frequency, may be inserted in either of the paths 78 or 78' to avoid interference should the intermediate frequency of the receiver by close to the channel frequency.

While particular embodiments of the present invention have been shown and described, it will be obvious to those skilled in the art that changes and modifications may be made without departing from this invention in its broader aspects, and, therefore, the aim in the appended claims is to cover all such changes and modifications as fall within the true spirit and scope of this invention.

I claim:

1. A tuning system for a wave-signal receiver for selectively utilizing any of a group of wave signals included within a given band of frequencies comprising: a movable carriage; a plurality of radio-frequency selectors, individually selective to a different one of said wave signals, mounted on said carriage to be moved sequentially into an operating position; a driving system coupled to said carriage for effecting movement thereof; a stationary connector located at said operating position for establishing circuit connections with the one of said selectors moved into said position; a heterodyning oscillator tunable over an operating frequency range corresponding to said band of frequencies and including a physically displaceable tuning element; an individual and adjustable actuator for said element associated with each of said selectors and movable into actuating engagement with said tuning element as its associated selector is moved into said operating position; and a frequency converter in circuit engagement with said oscillator, said connector, and the selector in said operating position for developing an intermediate-frequency signal corresponding to the wave signal selected by the operative one of said selectors.

2. A tuning system for a wave-signal receiver for selectively utilizing any of a group of wave signals included within a given band of frequencies comprising: a rotatable turntable; a plurality of radio-frequency selectors, individually selective to a different one of said wave signals, mounted on said turntable to be moved sequentially into an operating position; a driving system coupled to said turntable for effecting rotation thereof; a stationary connector located at said operating position for establishing circuit connections with the one of said selectors moved into said position; a heterodyning oscillator tunable over an operating frequency range corresponding to said band of frequencies and including a physically displaceable tuning element; an individual and adjustable actuator for said element associated with each of said selectors and movable into actuating engagement with said tuning element as its associated selector is moved into said operating position; and a frequency converter in circuit engagement with said oscillator, said connector, and the selector in said operating position for developing an intermediate-frequency signal corresponding to the wave signal selected by the operative one of said selectors.

3. A tuning system for a wave-signal receiver for selectively utilizing any of a group of wave signals included within a given band of frequencies comprising: a rotatable turntable having a circular array of apertures disposed about the axis of rotation; a plurality of radio-frequency selectors, individually selective to a different one of said wave signals, mounted on said turntable to be moved sequentially into an operating position; a driving system including a driving gear in meshing engagement with said array of apertures for effecting rotation of said turntables; a stationary connector located at said operating position for establishing circuit connections with the one of said selectors moved into said position; a heterodyning oscillator tunable over an operating frequency range corresponding to said band of frequencies and including a physically displaceable tuning element; an individual and adjustable actuator for said element associated with each of said selectors and movable into actuating engagement with said tuning element as its associated selector is moved into said operating position; and a frequency converter in circuit engagement with said oscillator, said connector, and the selector in said operating position for developing an intermediate-frequency signal corresponding to the wave signal selected by the operative one of said selectors.

4. A tuning system for a wave-signal receiver for selectively utilizing any of a group of wave signals included within a given band of frequencies comprising: a rotatable turntable having a circular array of slots disposed about the axis of rotation; a plurality of radio-frequency selectors, individually selective to a different one of said wave signals, mounted on said turntable to be moved sequentially into an operating position and having contact blocks extending through said slots; a driving system for effecting rotation of said turntable; a stationary connector located at said operating position for engaging the contact block of the one of said selectors moved into said position; a heterodyning oscillator tunable over an operating frequency range corresponding to said band of frequencies and including a physically displaceable tuning element; an individual and adjustable actuator for said element associated with each of said selectors and movable into actuating engagement with said tuning element as its associated selector is moved into said operating position; and a frequency converter in circuit engagement with said oscillator, said connector, and the selector in said operating position for developing an intermediate-frequency signal corresponding to the wave signal selected by the operative one of said selectors.

5. A tuning system for a wave-signal receiver for selectively utilizing any of a group of wave signals included within a given band of frequencies comprising: a rotatable turntable having a circular array of slots disposed about the axis of rotation; a plurality of radio-frequency selectors, individually selective to a different one of said wave signals, mounted on said turntable to be moved sequentially into an operating position and having contact blocks extending through said slots; a driving system for effecting rotation of said turntable; a stationary connector located at said operating position for engaging the contact block of the one of said selectors moved into said position; a heterodyning oscillator tunable over an operating frequency range corresponding to said band of frequencies and including a physically displaceable tuning element movable along a path extending from said operating position; means for biasing said element toward said operating position normally to tune said oscillator to one end of its frequency range; an individual and adjustable actuator for said element associated with each of said selectors and movable therewith into said operating position to engage and displace said element along said path; and a frequency converter in circuit engagement with said oscillator, said connector, and the selector in said operating position for developing an intermediate-frequency signal corresponding to the wave signal selected by the operative one of said selectors.

6. A tuning system for a wave-signal receiver for selectively utilizing any of a group of wave signals included within a given band of frequencies comprising: a rotatable turntable including a supporting member having a circular array of slots disposed about the axis of rotation; a plurality of radio-frequency selectors, individually selective to a different one of said wave signals, mounted on said turntable to be moved sequentially into an operating position and having contact blocks extending through said slots; a driving system for effecting rotation of said turntable; a stationary connector located at said operating position for engaging the contact block of the one of said selectors moved into said position; a heterodyning oscillator tunable over an operating frequency range corresponding to said band of frequencies and including a physically displaceable tuning element movable along a path extending from said operating position; means for biasing said element toward said operating position normally to tune said oscillator to one end of its frequency range; an individual and adjustable actuator for said element associated with each of said selectors and movable therewith into said operating position to engage and displace said element along said path; and a frequency converter permanently connected to said oscillator and to said connector for developing an intermediate-frequency signal corresponding to the wave signal selected by the one of said selectors in said operating position.

7. A system for selectively tuning a television receiver to any signal channel in a very high frequency band and in a separate ultra high frequency band comprising: a rotatable turntable having a circular array of slots disposed about the axis of rotation; a plurality of selectors, individually selective to a different channel in said bands, mounted on said turntable to be moved sequentially into one of a pair of operating positions and having contact blocks extending through said slots; a driving system for rotating said turntable; a pair of stationary connectors located respectively at said operating positions for engaging the contact block of the one of said selectors moved into the corresponding operating position; a pair of heterodyning oscillators individually tunable over an operating frequency range corresponding to a different one of said bands of frequencies and including a physically displaceable tuning element; an individual and adjustable actuator for each of said selectors mounted on said turntable for movement into actuating engagement with one of said tuning elements as its associated selector is moved into one of said operating positions; a first frequency converter for receiving a heterodyning signal from one of said oscillators and for receiving through one of said connectors a signal channel in one of said bands to derive therefrom a signal of a predetermined intermediate frequency; a second frequency converter for receiving a heterodyning signal from the other of said oscillators and for receiving through the other of said connectors a signal channel in the other of said bands to derive therefrom a signal of the same intermediate frequency; and a switch for concurrently energizing a particular one of said oscillators and for connecting the associated one of said frequency converters to a common intermediate-frequency channel of the receiver.

ROGER M. NORDBY.

References Cited in the file of this patent

UNITED STATES PATENTS

| Number | Name | Date |
|---|---|---|
| 2,078,908 | Harrison | Apr. 27, 1937 |
| 2,078,909 | Gunther | Apr. 27, 1937 |
| 2,100,402 | Lyons | Nov. 30, 1937 |
| 2,400,860 | Whalley et al. | May 21, 1946 |
| 2,516,272 | Thompson | July 25, 1950 |
| 2,545,681 | Zepp et al. | Mar. 20, 1951 |
| 2,557,234 | Rieth | June 19, 1951 |